(12) United States Patent
Koeppe et al.

(10) Patent No.: US 8,780,648 B2
(45) Date of Patent: Jul. 15, 2014

(54) LATCH BASED MEMORY DEVICE

(71) Applicant: Infineon Technologies AG, Neubiberg (DE)

(72) Inventors: Siegmar Koeppe, Munich (DE); Winfried Kamp, Munich (DE); Julie Aunis, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/682,867

(22) Filed: Nov. 21, 2012

(65) Prior Publication Data

US 2013/0141987 A1 Jun. 6, 2013

Related U.S. Application Data

(62) Division of application No. 12/876,560, filed on Sep. 7, 2010, now Pat. No. 8,331,163.

(51) Int. Cl.
*G11C 7/10* (2006.01)

(52) U.S. Cl.
USPC .................................. 365/189.05; 365/189.02

(58) Field of Classification Search
USPC ........................... 365/189.05, 189.02, 189.12
See application file for complete search history.

(56) References Cited

U.S. PATENT DOCUMENTS

| | | | | |
|---|---|---|---|---|
| 4,434,432 A | * | 2/1984 | Dailey et al. | 347/115 |
| 5,887,002 A | * | 3/1999 | Cooke et al. | 714/725 |
| 2011/0276848 A1 | | 11/2011 | Hughes | |

* cited by examiner

*Primary Examiner* — Huan Hoang
(74) *Attorney, Agent, or Firm* — Slater & Matsil, L.L.P.

(57) ABSTRACT

A method of testing a latch based memory device is disclosed. The latch based memory device includes a number of latches, electrical connections and a circuit environment of the latches. A storage functionality of the latches can be tested during a first test phase while a functionality of the electrical connections and the circuit environment of the latches can be tested during a second test phase.

19 Claims, 13 Drawing Sheets

LATCH BASED MEMORY DEVICE

This is a divisional application of U.S. application Ser. No. 12/876,560, which was filed on Sep. 7, 2010 and is incorporated herein by reference.

TECHNICAL FIELD

The present invention relates to a latch based memory device and a method of testing a latch based memory device.

BACKGROUND

The steadily decreasing size and growing density and complexity of integrated circuit devices, such as processors, has made testing more difficult and costly. Therefore, modern integrated circuits usually incorporate a variety of design-for-test structures to enhance their inherent testability. Design-for-testability (DFT) refers to a technique for reducing the complexity associated with design testing by including test logic and access points for accessing such test logic within an integrated circuit device. Typically, the DFT structures are based on a scan design or an automatic test pattern generation (ATPG) design, where scan test or ATPG test data may be provided to a test pin or where a plurality of externally accessible scan chains may be embedded into the integrated circuit. Typically, scan test design is used in conjunction with fault simulation and combinational automatic test pattern generation to generate manufacturing and diagnostic test patterns for production test and prototype debug processes.

With respect to latch based memory devices such as, for example, register files, the standard or conventional test approach, namely a scan test with an ATPG pattern generation, is highly complex and cost inefficient. Therefore, latch based memory devices are tested either by functional bit patterns or by implementing additional hardware like, for example, memory built-in self-test (MBIST) structures. With functional bit patterns a significant additional programming effort as well as administrative effort in the work-out of test procedures and in the management of test runs will be necessary. Additional MBIST hardware requires additional development effort and additional space on the device. Moreover, the MBIST circuitry may cause additional leakage current and electrical power loss.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description. Like reference numerals designate corresponding similar parts.

DETAILED DESCRIPTION OF ILLUSTRATIVE EMBODIMENTS

Figure 1A:
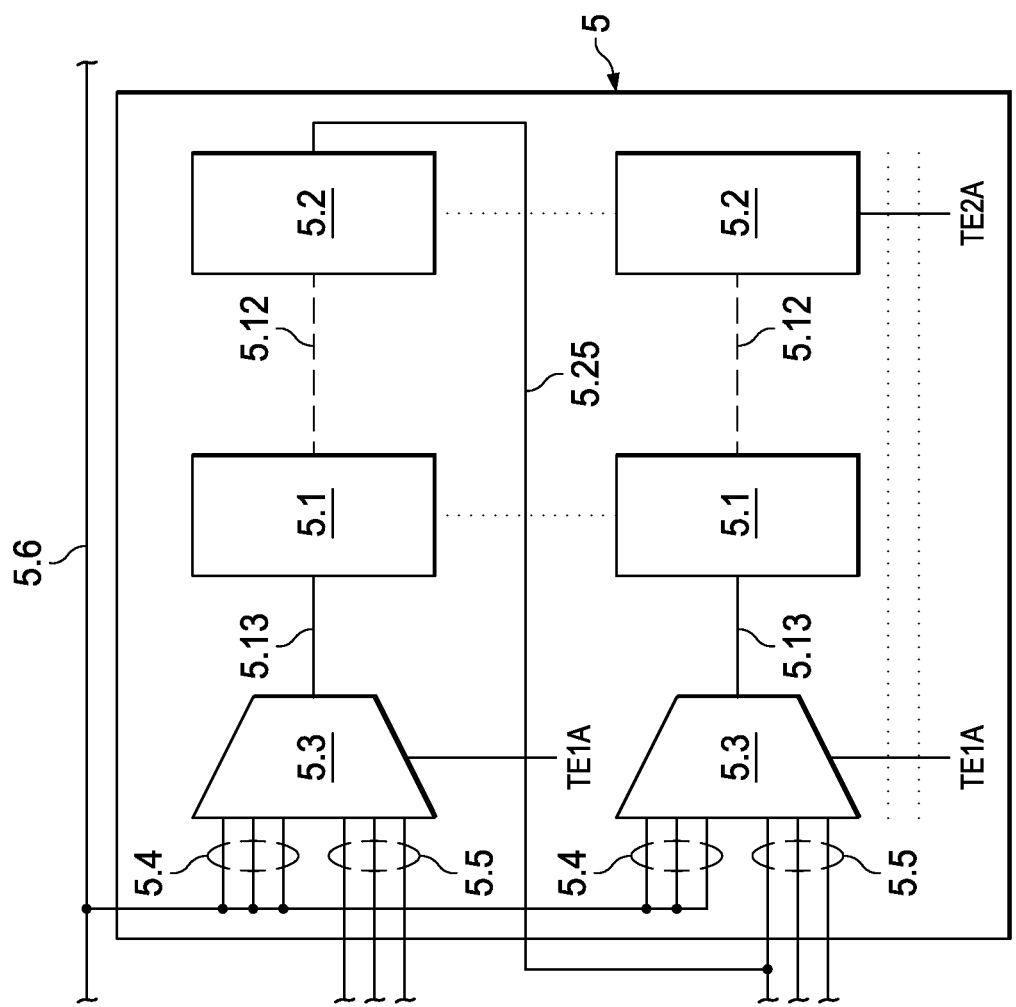
FIG. 1A shows a latch based memory device according to one embodiment of the present disclosure.

The aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Embodiments of a method of testing a latch based memory device and embodiments of a latch based memory device may include different types of latch based memory devices. The latch based memory device used can be in principle any memory device including a plurality of latches like, for example, a register file, in particular, a single-port register file or a multi-port register file, a random access memory device or a programmable memory device like a field programmable gate array memory device.

One important aspect of the present application is the use of so-called multiple input port register files or multi-input port or multi-port register files as called in this application. These are register files in which data may be supplied to the register file over more than one write data port by using a respective own write address for storing the data at the respective write addresses. These register files normally have a control system which takes care that no conflicts arise, i.e., no two data are going to be written onto the same write address.

Referring to FIG. 1A, a latch based memory device is depicted according to one embodiment of the present disclosure. The latch based memory device 5 includes a plurality of latches including first set of latches 5.1 and second set of latches 5.2, each one of the first set of latches 5.1 being connected with a multiplexer 5.3, the multiplexer 5.3 being arranged before the first set of latches 5.1, wherein each one of the first set of latches 5.1 is serially connectable with one of the second set of latches 5.2 as denoted by line 5.12, and the first set and second set of latches 5.1 and 5.2 are controllable with independent enable signals, i.e., signals which can be individually selected or determined. As will be shown further below in detail, the first and second set of latches 5.1 and 5.2 may be controlled with complementary clock signals in one mode and they may be switched to a transparent state in another mode when the first and second sets of latches 5.1 and 5.2 are enabled. In the transparent state, the function of a non-inverting latch may be converted to a buffer. If the transfer function of the latch includes an inversion, the function of the latch in the transparent state is equivalent to an inverting buffer.

Each multiplexer 5.3 of the first set of latches 5.1 comprises a first set of inputs 5.4 and a second set of inputs 5.5. The first set of inputs 5.4 comprises at least one data input which receives data from a data line 5.6. The second set of inputs 5.5 comprises at least one test input which receives at least one test signal for testing. In one embodiment, the output of each multiplexer 5.3 is connected to an input of a corresponding latch of the first set of latches 5.1 as denoted by line 5.13.

For testing of the latch based memory device 5, the memory circuit will be reconfigured so that all latches 5.1 and 5.2 are serially connected with each other. That means each one of the latches has its input connected to another one of the latches and its output connected to another one of the latches. For example, the output of each of the first set of latches 5.1 is connected to an input of each of the second set of latches 5.2. In one embodiment, one of the at least one test input 5.5 of a subset of the first set of multiplexers 5.3 is connected to an output of a subset of the second set of latches 5.2 as denoted by line 5.25 to form a shift register chain.

One of the first set of latches 5.1 is determined as the latch for inputting the bit sequence and another one of the second set of latches 5.2 is determined as an end latch for outputting and reading the bit sequence shifted through the shift register chain. With this configuration, shift testing of the latch based memory device 5 becomes possible wherein the determination and generation of the bit sequence can, for example, be performed like with the classical and conventional ATPG pattern generation. Only simple and easy to implement hardware extensions will have to be implemented to allow the reconfiguration of the memory device for performing the test mode. All this becomes possible without requiring additional effort with functional bit patterns and without reserving additional chip space for MBIST hardware.

One advantage of the latch based memory device lies in the fact that it offers the possibility to test a significant portion or even all of the hardware of the memory circuit with the classical ATPG approach. As will be shown further below, the latch based memory device can advantageously include a register file as an example of a latch-based memory device. In a register file including, for example, a plurality of input latches and data or storage latches, testing of the data or storage latches and testing of the input latches will be possible, as will be shown in further detail below. The bit sequence, which is to be input in any one of the test modes, can be either a predetermined known bit sequence or alternatively an unknown randomly generated bit sequence which is to be shifted through the memory circuit and sent through a delay path in parallel so that afterwards both bit sequences are simply compared with each other. The bit sequence is of a sufficient length and comprises at least one data transition.

In FIG. 1A, the latch-based memory device 5 further includes means for supplying a first test signal (TE1) to the latch based memory device 5 and for setting the first test signal (TE1) to a predetermined signal level for supplying a first control signal (TE1A) to the control input of the multiplexers 5.3. The latch-based memory device 5 further includes means for inputting a bit sequence into the first and second set of latches 5.1 and 5.2, means for reading a bit sequence out of the first and second set of latches 5.1 and 5.2, and means for comparing the output bit sequence with the input bit sequence to evaluate the functionality of the latches.

In addition, the first set of latches 5.1 and the second set of latches 5.2 are controllable to a transparent state. In the context of the present disclosure, a transparent state refers to output data of one latch being unconditional input data of its input when the latch is enabled. As will be explained in more detail further below, this corresponds to a particular test mode which allows testing of the functionality of the electrical connections and the circuit environment of the first set of latches 5.1 of the latch based memory device 5.

In FIG. 1A, the latch based memory device 5 further includes means for supplying a second test signal (TE2) to the latch based memory device 5 and for setting the second test signal (TE2) to a predetermined signal level, such as a level 1, for supplying a second control signal (TE2A) to an input of at least a subset of the second set of latches 5.2.

Figure 1B:
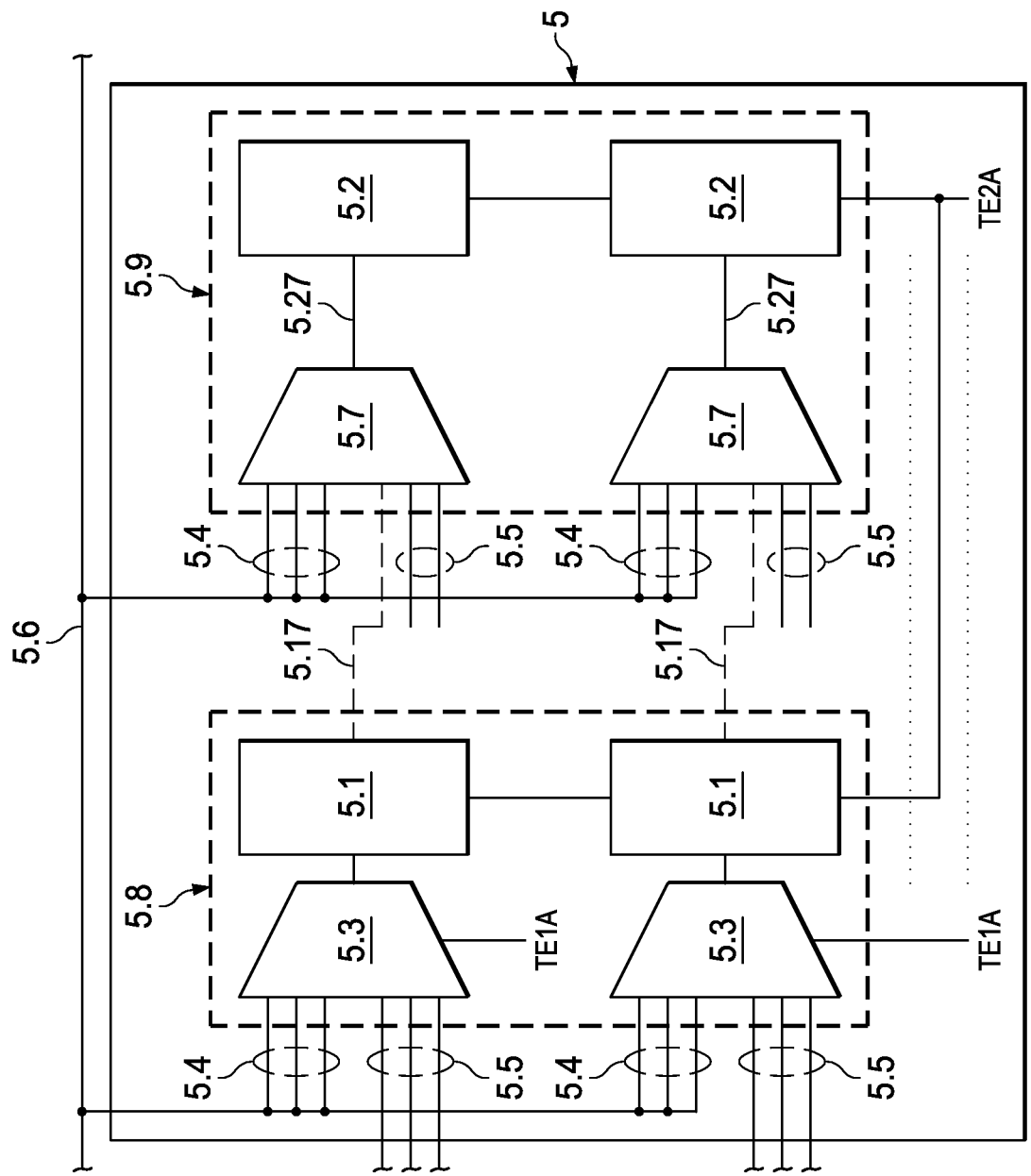
FIG. 1B shows a latch based memory device according to an alternative embodiment of the present disclosure.

Referring to FIG. 1B, a latch based memory device is depicted according to an alternative embodiment of the present disclosure. The latch based memory device 5 may be implemented as a register file or a first-in-first-out (FIFO) memory device. In this embodiment, the first and second latches 5.1 and 5.2 are serially connectable with one another. As shown in FIG. 1B, each one of the first set of latches 5.1 is serially connectable with one of the second set of latches 5.2 by means of a second multiplexer 5.7 which is arranged before each of the second set of latches 5.2. Each second multiplexer 5.7 of the second set of latches 5.2 comprises a first set of inputs 5.4 and a second set of inputs 5.5. The first set of inputs 5.4 comprises at least one data input which receives data from a data line 5.6. The second set of inputs 5.5 comprises at least one test input which receives at least one test signal for testing. In one embodiment, the output of each second multiplexer 5.7 is connected to an input of a corresponding latch of the second set of latches 5.2 as denoted by line 5.27. In addition, the output of each one of the first set of latches 5.1 is connected to one of the at least one test input of each second multiplexer 5.7 as denoted by line 5.17.

In one embodiment, the first and second set of latches 5.1, 5.2 are arranged in the form of structural words in the latch based memory file. In this case, a subset of the first set of multiplexers 5.3 and a subset of the first set of latches 5.1 form a first structural word 5.8. In a functional mode, the at least one data input 5.4 of a subset of first multiplexers 5.3 receives the first input word comprising data from the data line 5.6.

Similarly, a subset of the second set of multiplexers 5.7 and a subset of the second set of latches 5.2 form a second structural word 5.9. In a functional mode, the at least one data input 5.4 of the subset of second multiplexers 5.7 receives a second input word also comprising data from the data line 5.6. The data in the first input word and the second input word are the same data from data line 5.6. However, data within the first input word and the second input word may have the same or different data positions.

Although not shown in the figures, at least one of the first multiplexers 5.3 or second multiplexers 5.7 may serve as an input multiplexer for inputting the bit sequence so that at least one test input of this multiplexer is not connected with an output of a latch. In addition, at least one of the first multiplexers 5.3 or second multiplexers 5.7 may serve as an output for outputting the bit sequence so that the output of this multiplexer is not connected with an input of a latch.

Also illustrated in FIG. 1B, the latch based memory device 5 further includes means for supplying a second control signal TE2A to a control input of a subset of the second set of latches 5.2, respectively, to configure this subset of the second set of latches 5.2 to operate in a transparent state. In the case of a register file including both input latches and data or storage latches, the second control signal TE2A will be supplied to a control input of the data or storage latches.

Figure 1C:
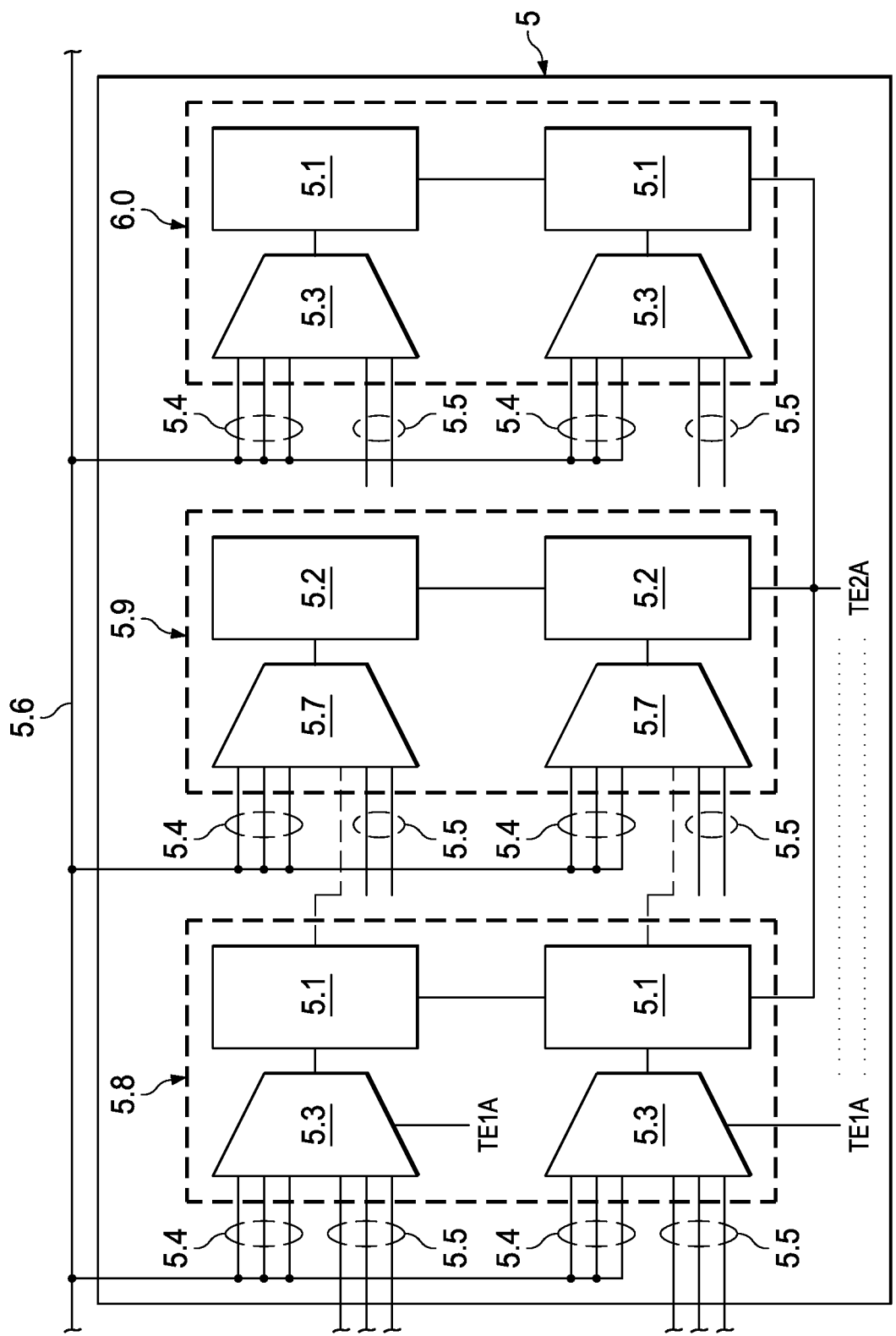
FIG. 1C shows a latch based memory device according to yet another embodiment of the present disclosure.

Referring to FIG. 1C, a latch based memory device is depicted according to yet another embodiment of the present disclosure. In this embodiment, a subset of first set of multiplexers 5.3 and a subset of the first set of latches 5.1 different from those shown in FIG. 1B form a third structural word 6.0. In a functional mode, the at least one data input 5.4 of the subset of first multiplexers 5.3 in the third structural word 6.0 receives a third input word also comprising data from the data line 5.6. The data in the first input word received in the first structural word 5.8 and the third input word received in the third structural word 6.0 are the same data from data line 5.6. However, data within the first input word and the third input word may have the same or different data positions. It is noted that additional subsets of first or second multiplexers 5.3, 5.7 and additional subsets of first or second sets of latches 5.1, 5.2 may be used to form additional structural words, and the at least one data input of these subsets of multiplexers may receive additional input words comprising data from the data line 5.6 and these additional input words may have the same data from data line 5.6 even though data within these input words may have the same or different data positions without departing the spirit and scope of the present disclosure.

Figure 2:
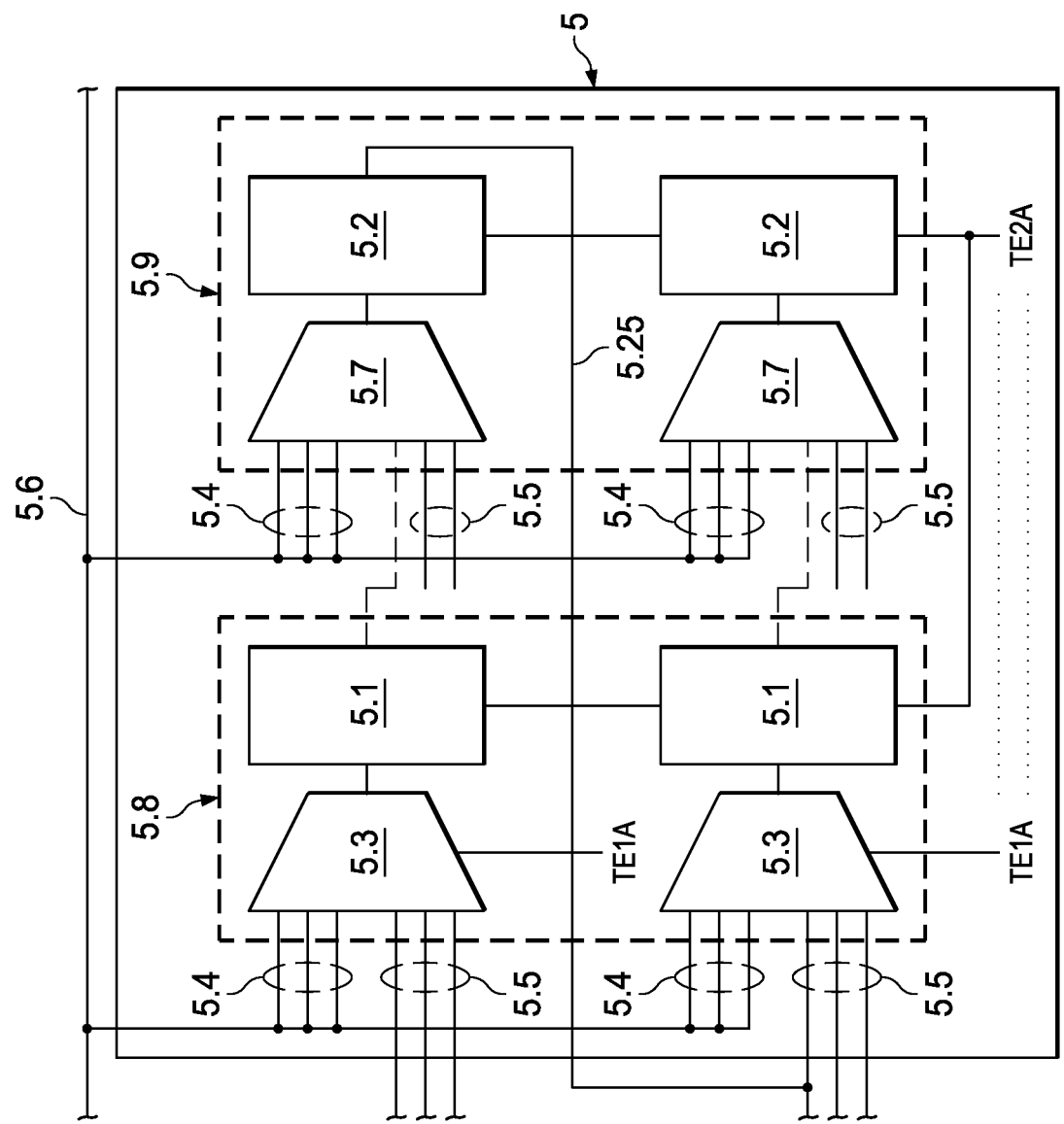
FIG. 2 shows a latch-based memory device in the form of a shift register chain in accordance with one embodiment of the present disclosure.

Referring to FIG. 2, a latch-based memory device in the form of a shift register chain is depicted in accordance with one embodiment of the present disclosure. Similar to FIG. 1B, a subset of first and second sets of latches 5.1, 5.2 and a subset of first and second sets of multiplexers 5.3, 5.7 are provided. However, to form a shift register chain, the output of a subset of the second set of latches 5.2 are connected to one of the at least one test input 5.5 of a subset of the first set of multiplexers 5.3 as denoted by line 5.25 in FIG. 2.

Figure 3:
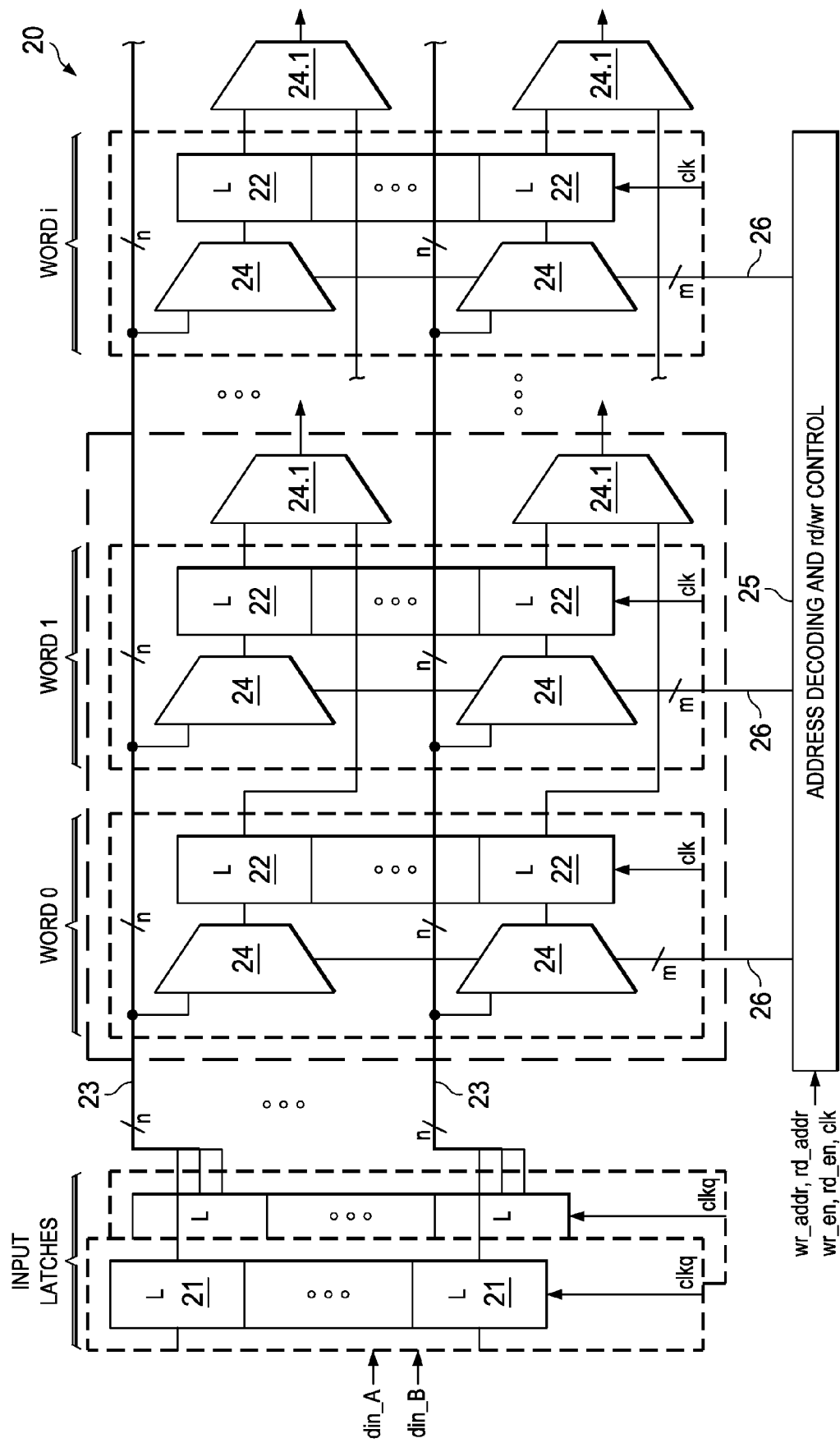
FIG. 3 shows a latch based memory device in a functional mode according to one embodiment of the present disclosure.

Referring to FIG. 3, a latch based memory device in a functional mode is depicted according to one embodiment of the present disclosure. In this embodiment, the latch based memory device 5 is implemented as a two-port register file 20. However, the number of write ports is not limited to two. The number of write ports may be any number higher than one, the register file thus becoming a multi-port register file.

The register file 20 includes input latches 21 and data latches 22, the input latches 21 being coupled with write input ports din_A and din_B, respectively, wherein the data latches 22 are arranged as part of an array of storage cells arranged in columns and rows, the columns corresponding to registers designated as word 0, word 1, . . . , word i. Each storage cell in the array of storage cell contains a single data latch 22 and its associated multiplexer 24. The input latches 21 are connected by data lines 23 to the array of storage cells. Each of the multiplexers 24 is associated with one of the data latches 22 while the multiplexers 24.1 function as output multiplexers and are not associated with the data latches 22.

Each of the multiplexers 24 includes at least one data input coupled to one of the data lines 23 associated with the respective rows of storage cells. The multiplexers 24 also include at least one test input for testing and will be explained in connection with FIG. 4. The multiplexers 24 also include an output coupled to at least one data input of one of the data latches 22. The multiplexers 24 also include at least one select control signal 26 connected with a read/write control logic 25. The read/write control logic 25 carries out address decoding procedures for generating signals to be sent onto the at least one control signal 26 connected with the multiplexers 24 for writing data into selected data latches 22 and controlling and switching of the associated multiplexers 24.

The read/write control logic 25 is arranged and configured to receive a write enable signal wr_en, a read enable signal rd_en, a write address signal wr_addr, a read address signal rd_addr, and a clock signal clk and to interpret and process these signals in order to control data latches 22 of the register file. The clock signal clk will be supplied to control inputs of the data latches 22, respectively, and a complementary clock signal clkq will be supplied to control inputs of the input latches 21, respectively.

The register file 20 in FIG. 3 depicts only those hardware elements which are necessary to carry out the normal functional operation of the register file 20 so that FIG. 3 can be regarded as a functional mode representation of the register file 20. As mentioned above, the register file 20 can be constructed as a multiple input port register file having, for example, n functional input ports. Each one of the data latches 22 has an associated multiplexer 24 for selecting one of the n functional input data bits. For building up the shift chain, each one of the multiplexers 24 needs to have one further input port which may be called here at least one test input as it only serves for the purpose of testing. Each multiplexer 24 thus includes n+1 input ports. The at least one test input becomes only relevant when entering the test mode of the register file 20 as will be outlined further below.

Figure 4:
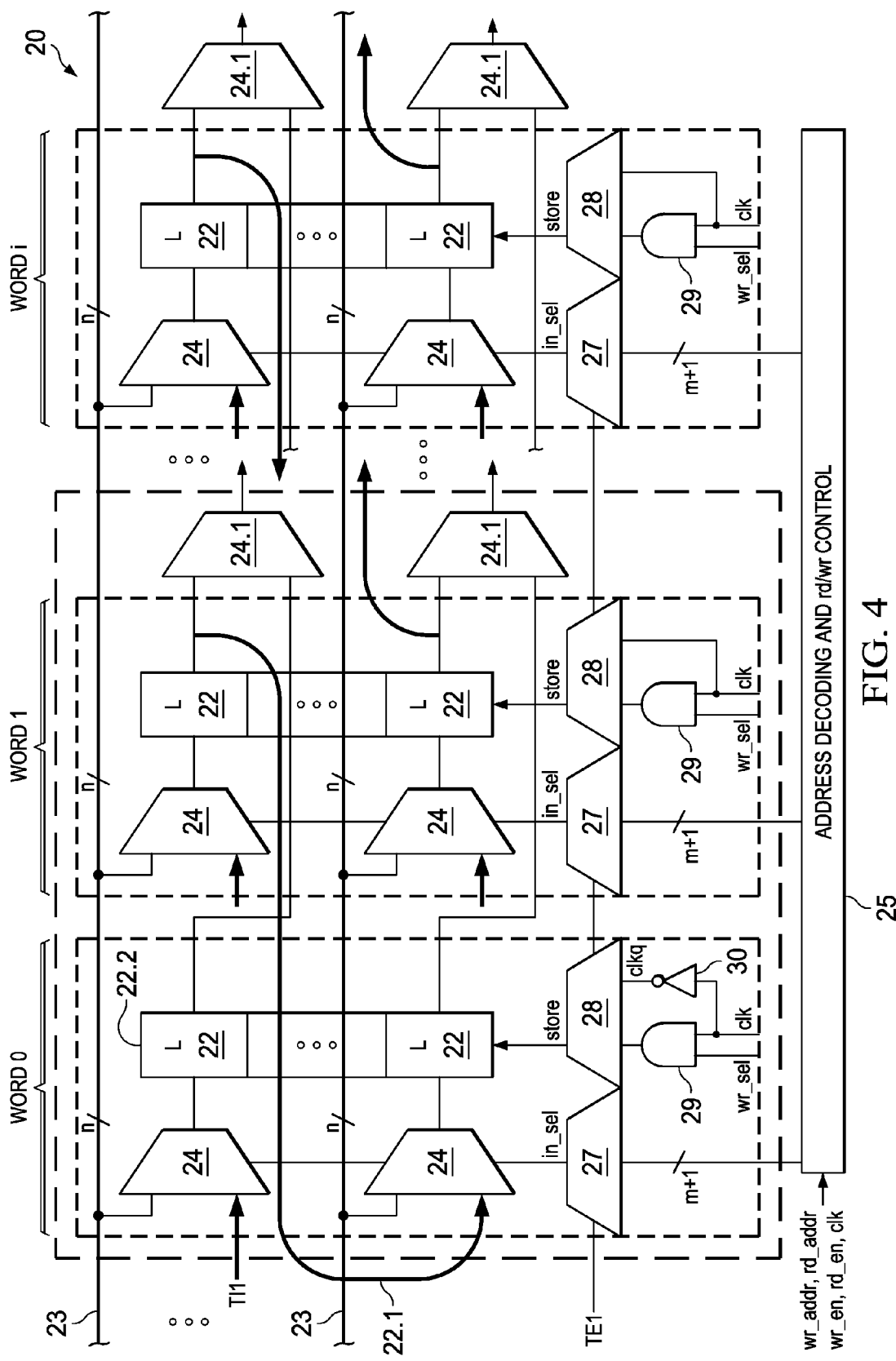
FIG. 4 shows a latched based memory device in a first test mode or a shift mode of operation in accordance with one embodiment of the present disclosure.

Referring to FIG. 4, a latched based memory device in a first test mode or a shift mode of operation is depicted in accordance with one embodiment of the present disclosure. The latch based memory device as shown in FIG. 4 is given by a register file 20 in which one or more data input are present. In the representation of the register file 20 in FIG. 4, the input latches have been omitted as they are of no relevance here. As shown, the multiplexers 24 include at least one test input that is connected with an output of a storage latch 22 of another storage cell. In the context of the present application, the terms data latches and storage latches may be used interchangeably. Each one of the storage latches 22 includes an output port which is connected to the at least one test input of a multiplexer 24 of another storage cell which is indicated by line 22.1.

For entering the first test mode or shift mode, in one exemplary implementation, each one of the multiplexers 24 which belong to a storage cell have to be configured so that one of the at least one test input or a shift input of multiplexers 24 is selected. In order to achieve this, the multiplexers 24 of each word structure are connected with a single multiplexer 27, wherein each one of the multiplexers 27 includes m+1 input ports, one output port and one control input port. Assuming that each one of the multiplexers 24 includes n=4 functional input ports, one will need either a signal m coded with 2 bits (m=2) or the multiplexers 24 will be supplied with pre-decoded signals so that m=n=4 in the functional mode according to FIG. 3. By taking into account the at least one test input of the multiplexers 24, the multiplexers 24 now have n+1=5 input ports and each one of the multiplexers 27 have m+1=5 input ports.

The first control signal TE1 is supplied to the control input ports of the multiplexers 27 if the functional mode or first test mode/shift mode is to be initiated. Depending on the signal level of the first test signal TE1, either a functional mode or a shift mode is selected. For example, to select a functional mode, the original m address bits as delivered by the read/write control logic 25 are passed to the multiplexers 24 as a signal in_sel, wherein the signal in_sel contains the m address bits and one bit of value 0 at the MSB position indicating that the functional mode is to be used (TE1=0 and, e.g., in_sel corresponds to 0-0100).

On the other hand, if a shift mode is to be selected, TE1 is switched to 1 and the original address bits are set to 0 so that the signal in_sel is generated having the form 1-0000 to cause all multiplexers 24 to select one of the at least one test input being a shift input. It is noted that this way of controlling the multiplexers 24 by using multiplexers 27 is only exemplary and other ways of controlling are possible, for example, by using an arrangement of logic gates between the read/write control logic 25 and the multiplexers 24 of one register, respectively.

Thus, during the functional mode, the at least one data input of multiplexers 24 is selected, while during the first test mode or shift mode, one of the at least one test input or a shift input is selected. In the functional mode, an input word of word length w will be provided from the input latches, wherein the word length w corresponds to the number of word lines 23 "n" times the number of latches within one word structure "b." In other words, w=n*b, wherein w represents the word length, n represents the number of write data ports corresponding to the number of word lines and b represents the bit length of each one of the write data ports.

The at least one data input of the multiplexers are connected such that, in a functional mode of the operation, data received at least one data input of first subset of the first set of multiplexers belonging to a first structural word (word 0 in this example) in the form of a first input word is the same data as data received at least one data input of the first subset of the second set of multiplexers belonging to the second structural word (word 1 in this example) in the form of a second input word. Thus, the data bits supplied to the latches of word 0 are the same data as data bits supplied to latches of word 1. However, the sequence of latches within one word structure is of no significance as compared with the arrangement of the latches within the shift register chain. In other words, the data bits within the first input word do not necessarily have the same/identical positions as the data bits within the second input word. If the shift register chain is arranged in a way different from the one shown in FIG. 4, the sequence of bits supplied to word 0 and word 1 is also different even though the plurality of data bits supplied to word 0 and word 1 are identical.

The representation of FIG. 4 of the register file 20 is therefore a first test mode in which the register file 20 is functionally converted to a shift mode. The first storage latch 22.2 of register word 0 can be utilized as a latch for inputting a bit sequence which is designated as TI1. This latch belongs to a storage cell comprising a multiplexer 24 which has one of the at least one test input or a shift input used for inputting a bit sequence for entering the first test mode or shift mode. The bit sequence can then be shifted through all storage latches 22 serially connected to each other.

The output bit sequence can be compared with the input bit sequence to evaluate the functionality of the storage latches. The implementation can be such that one longer chain can be formed by connecting all storage latches together or alternatively multiple independent chains of storage latches can be formed which can be tested in parallel or serially.

In order to shift the data of the bit sequence TI1 through the shift register chain of the serially connected storage cells, it is also necessary to supply certain predetermined clock signals to the storage latches 22. All storage latches 22 have a control input which is to be supplied with a clock signal or a signal which is complementary to the clock signal. By controlling the data latches 22 in such a way, it will be possible to obtain a master-slave shift register chain. The switching configuration as shown in FIG. 4 is such that the storage latches 22 of the register word 0 will behave as master latches and the storage latches 22 of the register word 1 will behave as slave latches. The global clock signal clk is supplied to each one of the word structures 0 and 1.

According to the embodiment of FIG. 4, each one of the word structures includes a control logic for adjusting the latches to a functional mode or a shift mode. The control logic as contained in each word will be described further below and it includes the multiplexer 27, the multiplexer 28 and a clock gating element (in this case, an AND gate) 29 as well as an inverter 30 for inverting clk. It is to be noted, however, that the control logic does not necessarily have to be part of each word structure but can also be part of the read/write control logic 25 or it can also be arranged in the form of an own circuit block arranged between the read/write control logic 25 and the latches 22 and multiplexers 24, respectively.

According to the embodiment of FIG. 4, the control logic in each one of the words includes a multiplexer 28, an output port of which is connected with a control input of all storage latches 22 of the respective word. The multiplexer 28 of word 0 further includes a first input port coupled to an output port of a clock gating element/AND gate 29 and a second input port coupled to an output of an inverter 30. The clock signal clk is supplied to the input of the inverter 30 so that a complementary clock signal clkq is supplied to the second input port of the multiplexer 28 of word 0. The clock signal clk is also supplied to a first input of the AND gate 29 wherein a read/write select signal wr_sel is supplied to a second input of the AND gate 29. The multiplexer 28 of word 0 allows selection between the clock signal at the output of AND gate 29 and the inverted clock signal at the output of the inverter 30.

If a functional mode is to be selected, TE1 is switched to 0 in which case the multiplexer 28 selects the output of the AND gate 29. In this mode, the storage latches 22 are to be controlled so that they fulfill their normal storage function controlled by read/write control logic 25 via the set of write select signals wr_sel (one per word). The output of the AND gate 29 and thus the output of the multiplexer 28 will only be high when the corresponding write select signal wr_sel is high so that data are stored in the storage latches 22 of the respective word whenever clk is high.

On the other hand, if the first test mode or shift mode is to be selected, TE1 is switched to 1 in which case the multiplexer 28 of word 0 selects the output of the inverter 30 so that a continuous complementary clock signal clkq is supplied to the control input of the storage latches 22 of the respective word. As can be seen in FIG. 4, the switching configuration is similar in word 1 with the exception that the inverter 30 is omitted so that in the first test mode or shift mode, the clock signal clk is directly supplied to the second input port of the multiplexer 28 in word 1 and thus to the control input of the storage latches 22 of the respective word. This scheme may be repeated for other words within this arrangement, for example, all even words containing an inverter 30, but all odd words do not. It will be appreciated here that the AND gate 29 is only an exemplary implementation for any kind of clock-gating of clock clk by enable signal wr_sel.

The multiplexers 28 each include a control input which is supplied with the first test signal TE1 when the first test mode or shift mode is to be entered. Supplying of the first test signal TE1=1 to the control input port of the multiplexers 28 results in the selection of the second input ports of the multiplexers 28 which in turn means that a complementary clock signal clkq is supplied to the storage latches 22 of word 0 (even) and a clock signal clk is supplied to the storage latches 22 of word 1 (odd) so that they function as a master-slave register.

Setting first test signal TE1 to 1 thus enables entering the first test mode or shift mode of the register file 20 namely by switching the multiplexers 24 to activate at least one test input to serially connect the storage units and in particular the storage latches 22 to each other and supplying clock signals and complementary clock signals to the storage latches 22 so as to form a master-slave shift register chain. When first test signal TE1 is set to 0, multiplexers 24 are switched to one of their regular functional input ports and data are stored in the storage latches 22 according to the regular functional mode of the register file 20 whenever the clock signal clk is active ("1"), controlled by the set of write select signals wr_sel supplied by the read/write control logic 25.

It is to be noted that also other implementations are possible. An essential aspect is that in the functional mode the latches are to be supplied with signals according to the current storage requirements and in the first test mode or shift mode, the latches of adjacent registers should be supplied with clock signals and complementary clock signals, respectively, in order to build up a shift register chain. This can also be accomplished with other hardware implementations than that of FIG. 4.

Figure 5:
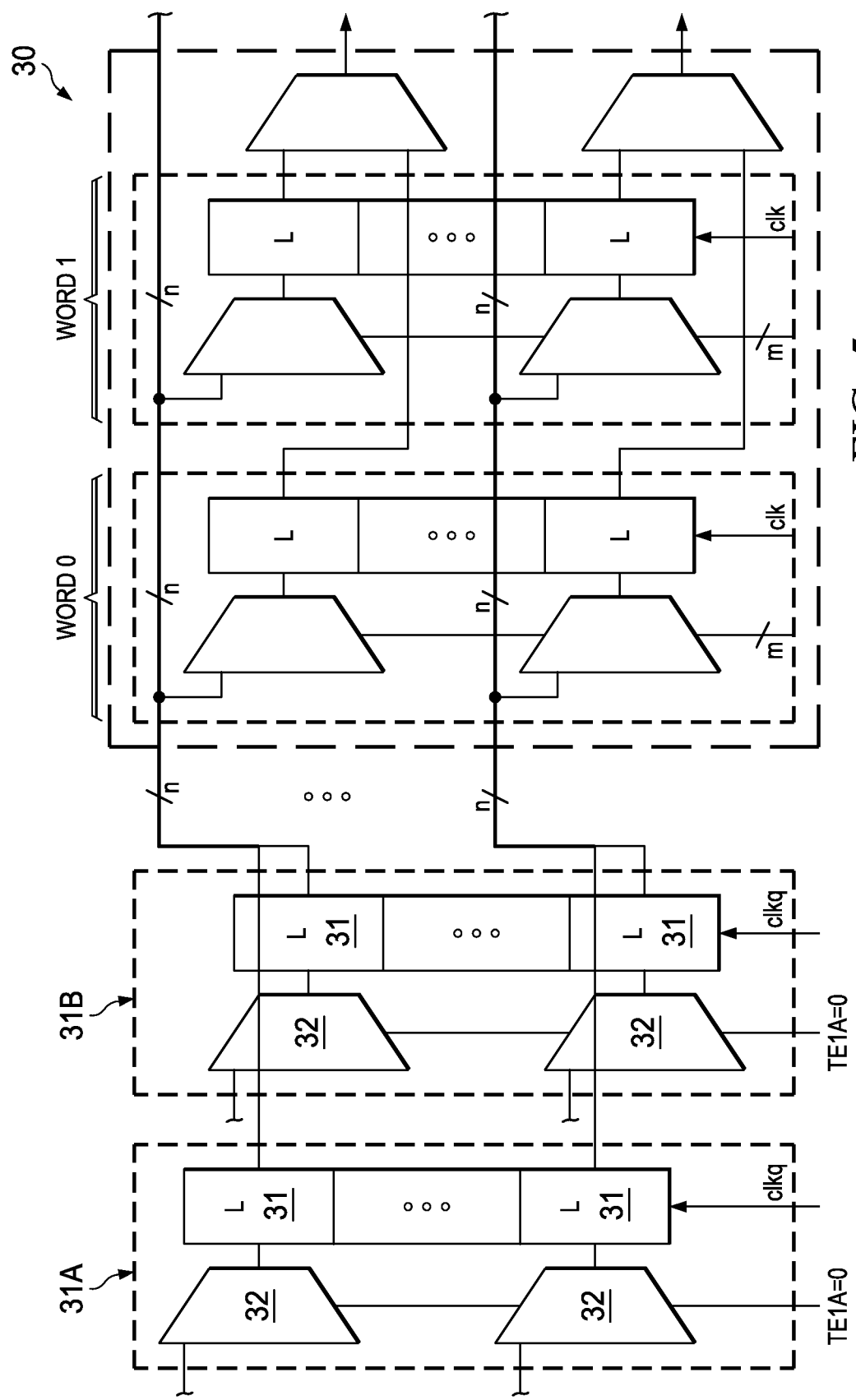
FIG. 5 shows a latch based memory device in a functional mode in accordance with an alternative embodiment of the present disclosure.
Figure 6:
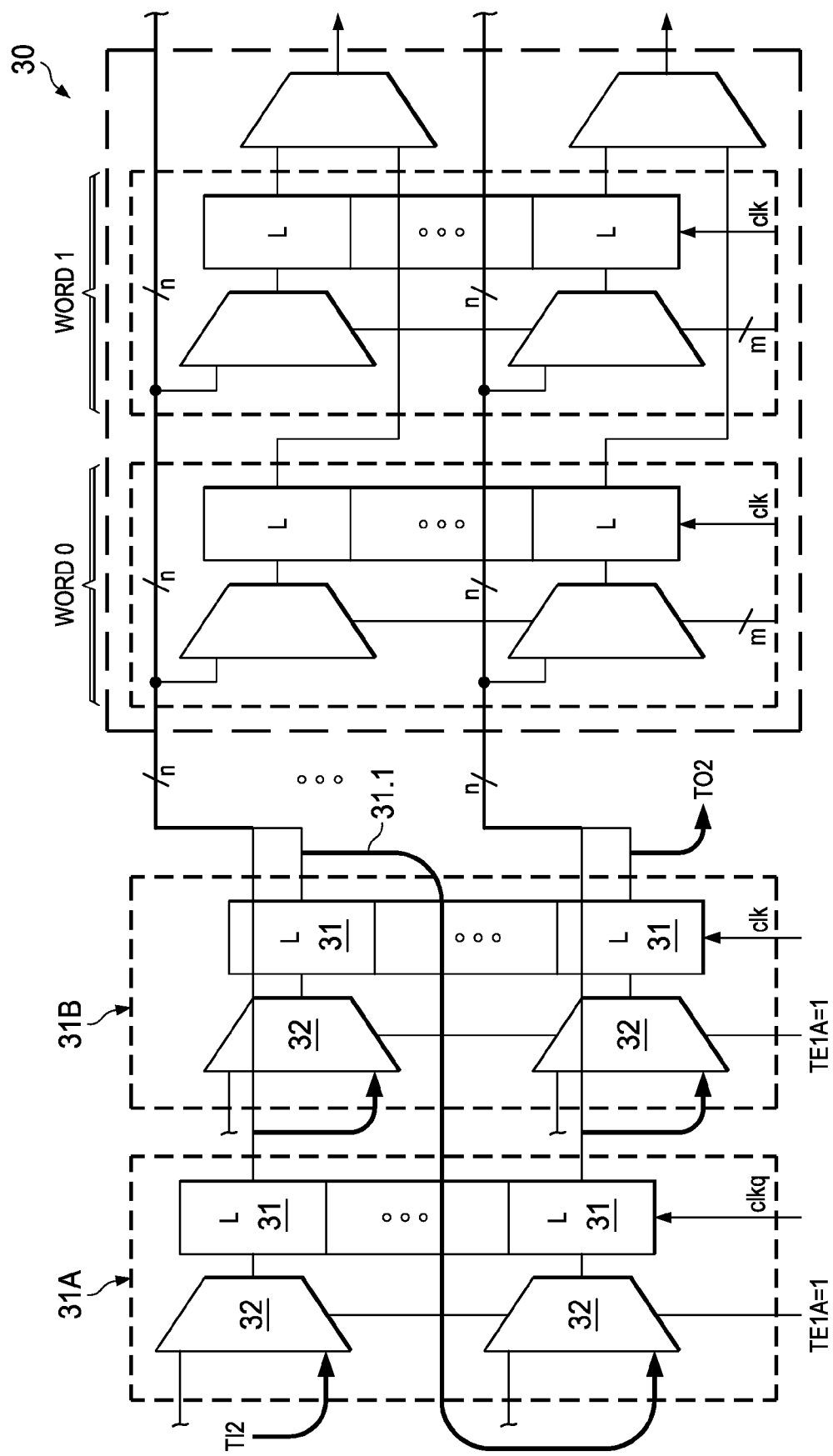
FIG. 6 shows a latch based memory device in a first test mode or shift mode in accordance with an alternative embodiment of the present disclosure.

Referring to FIGS. 5 and 6, the latch based memory device as shown in these figures is given by a multi-port register file 30 in which at least two data inputs are present. In FIGS. 5 and 6, at least two pairs of latches are connected in register file 30, with at least one pair being a pair of input latches and at least one pair being a pair of data latches. The principle functional structure of the register file 30 is similar to that of the register file 20 as shown and described in FIGS. 3 and 4 so that similar or equal parts or portions will not be described again. In particular, the array of storage cells of register file 30 can be similar or equal to the array of storage cells of register file 20.

The focus of FIGS. 5 and 6 is on the configuration of the input latches and the test logic for testing the input latches. Each one of the input latches 31 has a multiplexer 32 associated therewith. Each one of the multiplexers 32 includes an output, at least one test input being a shift input, and a control input TE1A. FIG. 5 shows a latch based memory device in a functional mode in accordance with an alternative embodiment of the present disclosure. Register file 30 comprises input latches 31 of a first input latch block 31A as well as the input latches 31 of a second input latch block 31B. The input latches 31 are supplied with one and the same clock signal clkq. The output of each one of the multiplexers 32 is connected with an input of the respective associated input latch 31 when a test signal TE1A is applied to the control input of the multiplexers 32. The test signal TE1A has a constant predefined potential, in this case a 0. In this case, the input latches function as a set of master latches while the data latches function as a set of slave latches.

FIG. 6 shows a latch based memory device in a first test mode or shift mode in accordance with an alternative embodiment of the present disclosure. In register file 30 as shown in FIG. 6, one of the at least one test input of each one of the multiplexers 32 is a shift input and it is connected with the output of the respective multiplexer 32 by applying a test signal TE1A to the control input of the multiplexers, respectively. The test signal TE1A has a constant predefined potential, in this case 1. Different from FIG. 5, the supply of clock signals to the input latches 31 is changed so that a complementary clock signal clkq is supplied to the input latches 31 of the first input latch block 31A and a clock signal clk is supplied to the input latches 31 of the second input latch block 31B. Thus, complementary clock signals are supplied to successive input latches of the shift register chain. In this case, the input latches 31 are serially connected to each other in a master-slave configuration in which the first set of input latches 31 in block 31A function as a set of master latches and the second set of input latches in block 31B function as a set of slave latches.

A bit sequence can be input into the at least one test input T12 of a first multiplexer 32 and shifted through the shift register chain formed by the serially connected input latches 31 as shown by line 31.1. To form a shift register chain, one of at least one test input or the shift input of a first multiplexer 32 corresponding to a first input latch is connected with an output of a second input latch. In this embodiment, the bit sequence is of a sufficient length and comprises at least one data transition. The bit sequence can be read out of the last input latch 31 of the chain at TO2 and compared with the input bit sequence fed in at the T12 to evaluate the storage functionality of the input latches 31. It is noted that the shift register chain delay needs to be compensated for comparison.

As was explained above in connection with the data latches, the implementation can be such that one longer chain can be formed by connecting all input latches together or alternatively multiple independent chains of input latches can be formed which can be tested in parallel or serially. It is also possible to form one long chain connecting therein all input latches and all data latches or multiple independent chains each of them connecting part of the input latches and part of the data latches.

Figure 7:
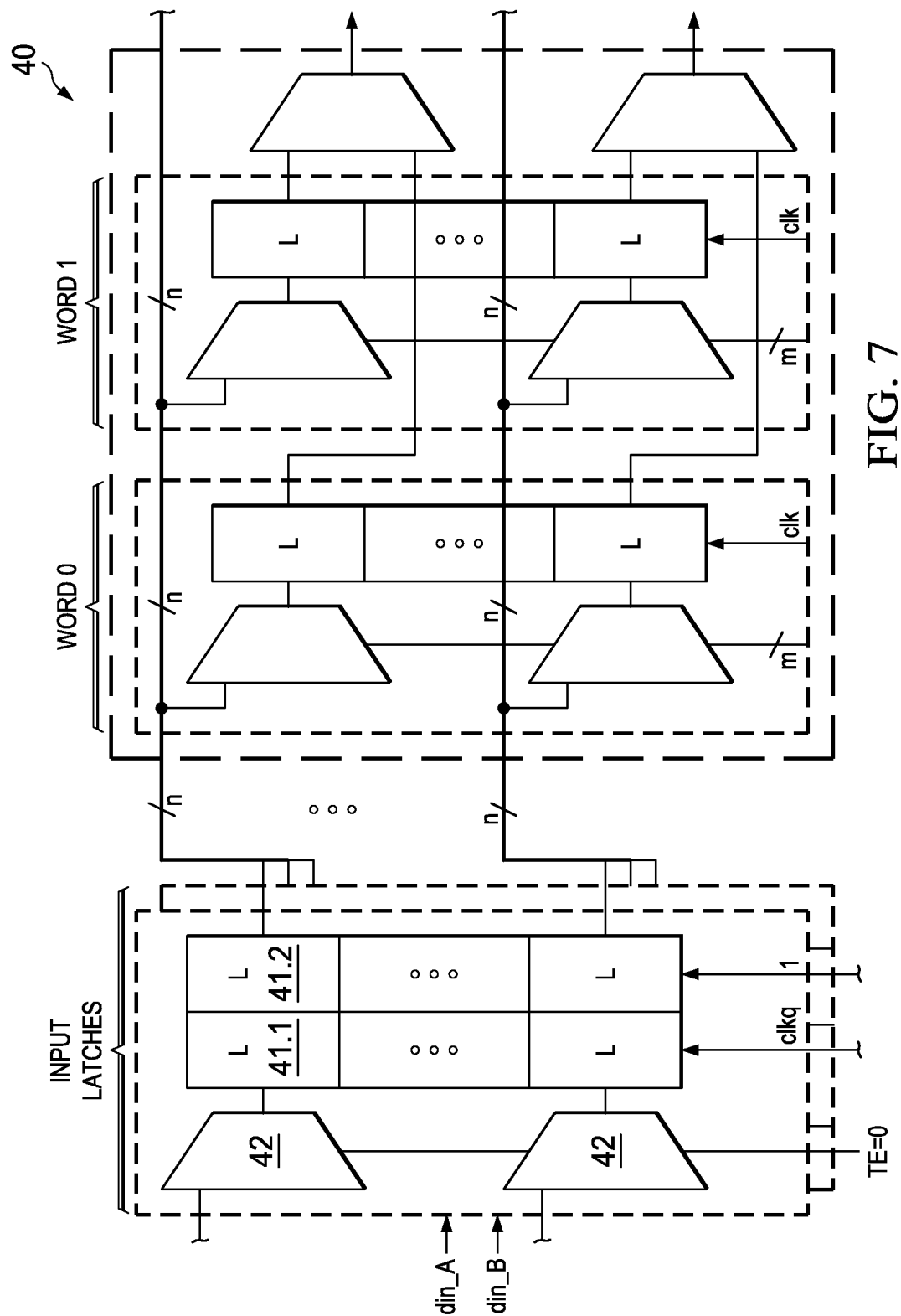
FIG. 7 shows a latch based memory device in a functional mode in yet another embodiment of the present disclosure.
Figure 8:
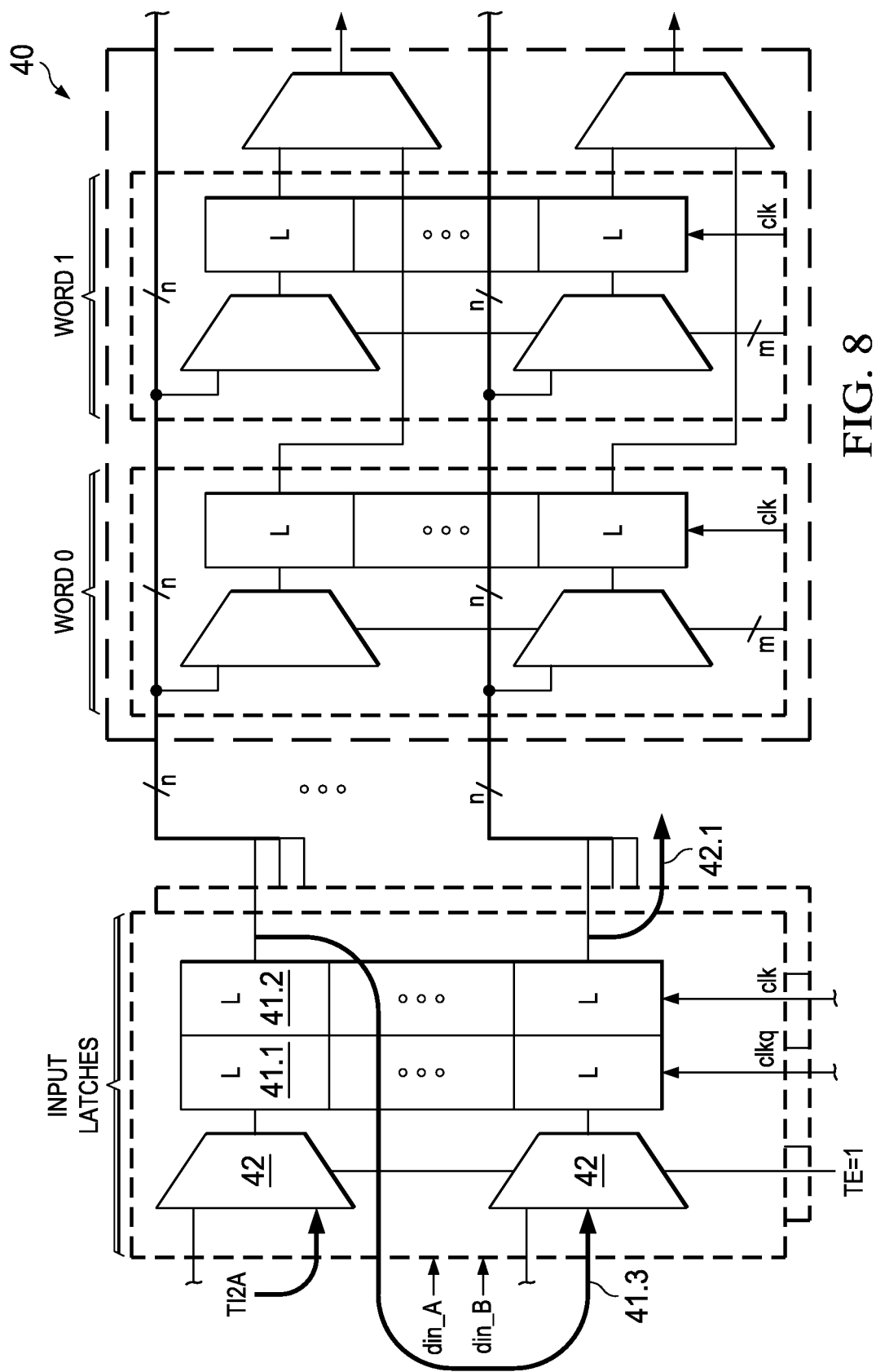
FIG. 8 shows a latch based memory device in a second test mode or a scan test mode in accordance with one embodiment of the present disclosure.

Referring to FIGS. 7 and 8, a latch based memory device in a functional or scan test mode are depicted in accordance with yet another embodiment of the present disclosure. The latch based memory device as shown in FIGS. 7 and 8 is given by a multi-port register file 40, which comprises two data ports. However, a device with at least one data port may also be implemented without departing the spirit and scope of the present disclosure. In addition, multiplexer 42 is illustrated in FIG. 7 for testing purpose, it is not necessary for selection of data. The principle functional structure of the register file 40 is similar to that of the register file 20 as shown and described in FIGS. 3 and 4 so that similar or equal parts or portions will not be described again. In particular, the array of storage cells of register file 40 can be similar or equal to the array of storage cells of register file 20.

As shown in FIGS. 7 and 8, input latches include a plurality of first set of input latches 41.1 and second set of input latches 41.2. The plurality of first and second sets of input latches 41.1 and 41.2 are serially connected to each other. Each pair of first and second sets of input latches 41.1 and 41.2 is associated with a multiplexer 42, an output of which is coupled to an input of each of the first set of input latches 41.1. The multiplexers 42 also include at least one data input, at least one test input, and at least one select control input. One of the at least one test input is a scan input being connected with an output of one of the second set of input latches 41.2 to form a scan register chain. The scan input of each one of the multiplexers 42 is also connectable with the output of the respective multiplexer 42 when a test signal TE is applied to the at least one select control input of the respective multiplexer 42 and the test signal TE having a constant predefined potential, for example, TE=1. It is to be noted that the second set of input latches 41.2 are not required for the regular function of the register file 40 and are only implemented for testing purposes.

FIG. 7 shows a latch based memory device in a functional mode in yet another embodiment of the present disclosure. As shown in register file 40 of FIG. 7, a clock signal clkq is supplied to the first set of input latches 41.1 and a constant predefined potential or constant control signal 1 is supplied to the clk input pin of the second set of input latches 41.2 so that the second set of input latches 41.2 are configured to operate in a transparent state and are therefore enabled. Also, a test signal TE=0 is applied to at least one select control input of the multiplexers 42 so that the multiplexers 42 are connecting the at least one data input, e.g., din_A to their output and thus, the data input pin of first set of input latches 41.1. In this case, the second set of input latches 41.2 forwards the data from the output of the first set of latches 41.1 to the data line 43 (not shown in FIG. 7) to supply the data inputs of the data latches shown on the right. Both the first and second set of input latches 41.1, 41.2 together function as a master set of latches while the data latches to the right function as a slave set of latches of the latch based memory device.

FIG. 8 shows a latch based memory device in a second test mode or a scan test mode in accordance with one embodiment of the present disclosure. As shown in the register file 40 of FIG. 8, a clock signal clk is supplied to the second set of input latches 41.2. The complementary clock signal clkq is supplied to the first set of input latches 41.1 so that the first and second set of input latches 41.1 and 41.2 are switched to a master-slave configuration in which the first set of input latches 41.1 function as a set of master latches and the second set of input latches 41.2 function as a set of slave latches. In this configuration, the structure behaves as a scan register which, depending on the test signal TE, behaves either as a parallel register bank (TE=0) or as a momentary shift register (TE=1).

When the test signal TE=0 is supplied to at least one select control input of the multiplexers 42, data at the at least one data input of multiplexers 42 is connected to the multiplexers output and thus to the inputs of the master-slave register cells comprised of first and second sets of input latches 41.1 and 41.2. When a test signal TE=1 is supplied to the at least one select control input of the multiplexers 42, one of the at least one test input or a scan input is connected to the output of the second set of input latches 41.2 as denoted by line 41.3. As a result, a scan register chain is formed so that a test bit sequence can be input into a first one of the multiplexers 42 at TI2A and the test bit sequence can be shifted fully or partially through the scan register chain. Any test results captured during a phase with TE=0 may be shifted out in an analogous manner from the output of the last one of the second set of input latches 41.2 as shown by the line 42.1 by setting the test signal TE to a constant predefined potential such as 1 for a certain number of clock cycles. During the scan test mode in which the test signal TE=1, the data latches are enabled and configured to operate in a transparent state as a combinational logic unit.

A further embodiment of a latch based memory includes a variant of FIG. 8, where the input latch structure is substituted by scan register cells, each cell including a multiplexer 42, a first input latch 41.1 as a master input latch and a second input latch 41.2 as a slave input latch. In contrast to FIGS. 7 and 8, a clock signal clk is always supplied to the second set of input latches 41.2, both in the functional and the scan test mode. Thus, the second set of input latches 41.2 operate in parallel to the corresponding data latches of the word being written.

Figure 9:
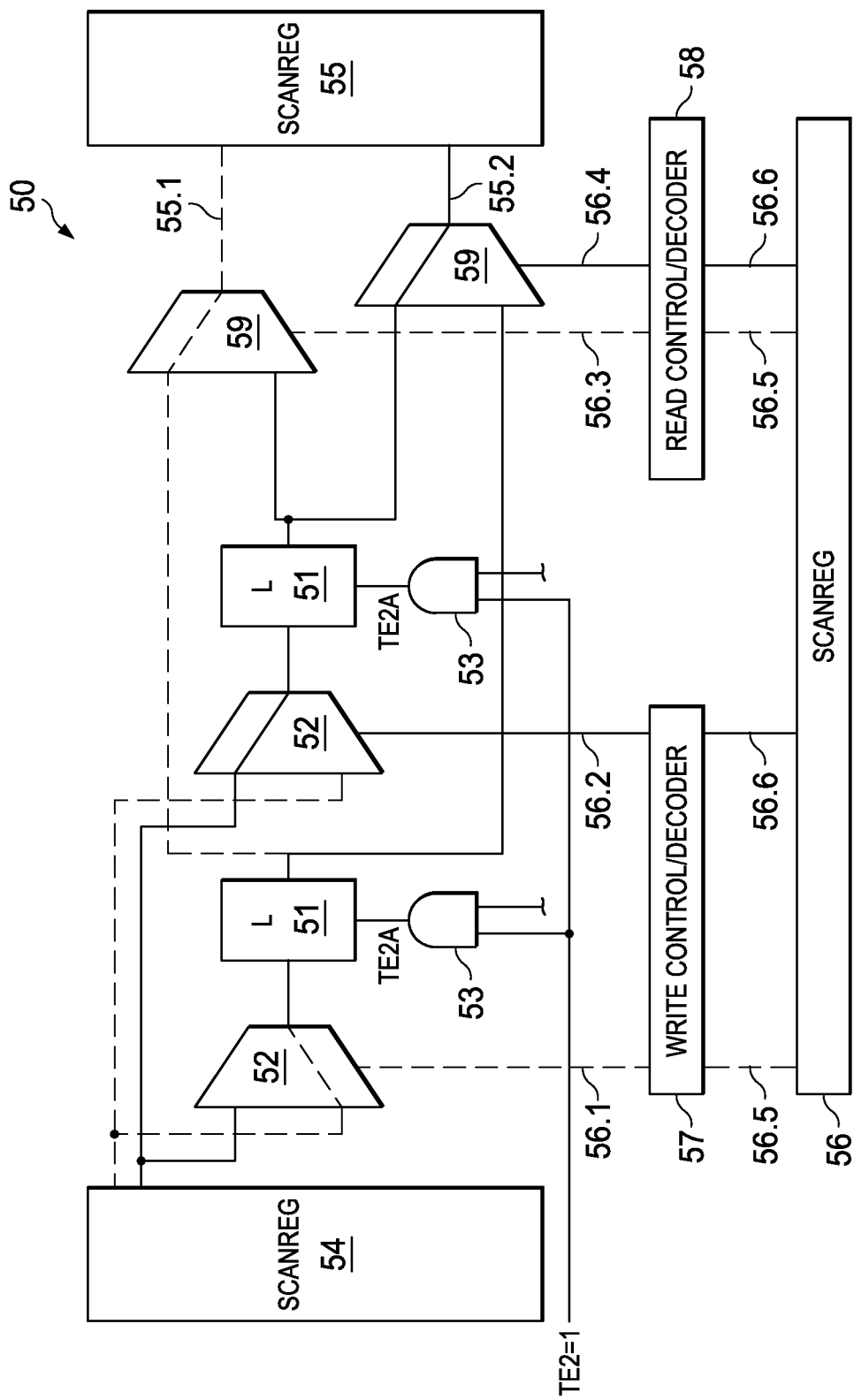
FIG. 9 shows a latch based memory device in a second test mode or a scan test mode in accordance with an alternative embodiment of the present disclosure.

Referring to FIG. 9, a latch based memory device in a second test mode or a scan test mode in accordance with an alternative embodiment of the present disclosure. The latch based memory device being shown in a scan test mode for testing external and internal logic. The register file 50 as shown in FIG. 9 includes storage cells, each storage cell containing a latch 51 and an associated multiplexer 52. The storage cells are arranged in the form of an array as described in previous embodiments. Only two storage cells (of a first row) are shown in FIG. 9.

An essential feature of the embodiment of FIG. 9 is that the storage latches 51 can be configured to operate in a transparent state and thus operate as combinational logic units by applying a test signal of a constant predefined potential to control inputs of the storage latches 51. For example, when a test signal TE2 with a constant predefined potential of 1 is applied, signal TE2 is input into a plurality of OR gates 53 and the output TE2A of OR gates 53 is also set to 1. The output TE2A of the OR gates 53 is then coupled to a control input of the storage latches 51 so that the storage latches 51 will be configured to operate in a transparent state. As their storage functionality may be tested independently by performing a shift-test in the first test mode or shift mode as described above, the focus during the second test phase or scan test mode is on the electrical connections and the circuit environment of the storage latches 51. Thus, the correctness of the electrical connections and the circuit environment of the storage latches may be evaluated in the scan test mode in terms of the structure of the circuit.

When the storage latches 51 are configured to operate in a transparent state, the functionality of the write decoder, the read decoder and the multiplexers 52 and 59 can be evaluated or tested by a conventional test approach, e.g., a scan test. For this purpose scan registers, such as input scan register 54, are provided which are connected with the input data bus lines, the output lines, and the write and read decoders. The storage latches 51 are configured to operate as a combinational logic unit in this case.

An input scan register 54 is connected with the internal bus lines of the register file to provide input data to the storage latches 51. In one embodiment, the input scan register 54 may be implemented as a plurality of input latches 41.1 and 41.2 as discussed before and shown in FIG. 8. In that case, at least one clock signal clkq is applied to the first set of input latches 41.1 and a second clock signal clk is applied to the second set of input latches 41.2. The value of the control signal TE (not shown in FIG. 9) applied to at least one select control input of multiplexers 42 defines the functionality of the input scan register as described with reference to FIG. 8.

An output scan register 55 is connected with the output lines of the register file to check the output of the storage latches 51 by a parallel capture of output data during the scan test. Only two output lines are shown in FIG. 9, lines 55.1 and 55.2. An additional scan register 56 may be connected with the write decoder 57 for controlling input multiplexers 52 and the read decoder 58 for controlling output multiplexers 59 as denoted by lines 56.1, 56.2 and lines 56.3, 56.4, respectively.

Line 56.5 between the scan register 56 and the write decoder 57 causes a particular write address port of the write decoder 57 to send a control signal along line 56.1 to an associated multiplexer 52 to connect one of the at least one inputs to the output. The storage latch 51 is then configured to operate in a transparent state and acts as a buffer. The path (dashed line) may continue through the register file 50 until it reaches multiplexer 59 which is addressed and controlled by a read output port of the read decoder 58 as denoted by line 56.3. Finally, the path (dashed line) continues to an output line 55.1 of the register file which is connected with the output scan register 55 where the output data is observed during scan test. In this way, the functionality of write and read access ports of the write decoder 57 and the read decoder 58 and multiplexers 52 and 59 along the path (dashed line) can be tested.

Similarly, the multiplexers and write access ports and read access ports along path (solid line) and all other paths inside the register file 50 can be tested. In that case, line 56.6 between the input scan register 56 and the write decoder 57 causes a particular write address port of the write decoder 57 to send a control signal along line 56.2 to an associated multiplexer 52 to connect one of the at least one inputs to the output. The storage latch 51 is then configured to operate in a transparent state and acts as a buffer. The path (solid line) may continue through the register file 50 until it reaches multiplexer 59 which is addressed and controlled by a read output port of the read decoder 58 as denoted by line 56.4. Finally, the path (solid line) continues to an output line 55.2 of the register file which is connected with the output scan register 55 where the output data is observed during scan test. In this way, the functionality of write and read access ports of the write decoder 57 and the read decoder 58 and multiplexers 52 and 59 along the path (solid line) can be tested.

In addition to providing an input scan register 54 to provide input data to the storage latches 51, an input unit may be provided in place of the input scan register 54. In that case, the input unit comprises a plurality of input latches and multiplexers as described above in FIGS. 5 and 6. During the second test mode or a scan test mode, the input unit may be configured to operate as another combinational logic unit by configuring the plurality of input latches to operate in a transparent state as described for the storage latches 51 in FIG. 9.

Figure 10:
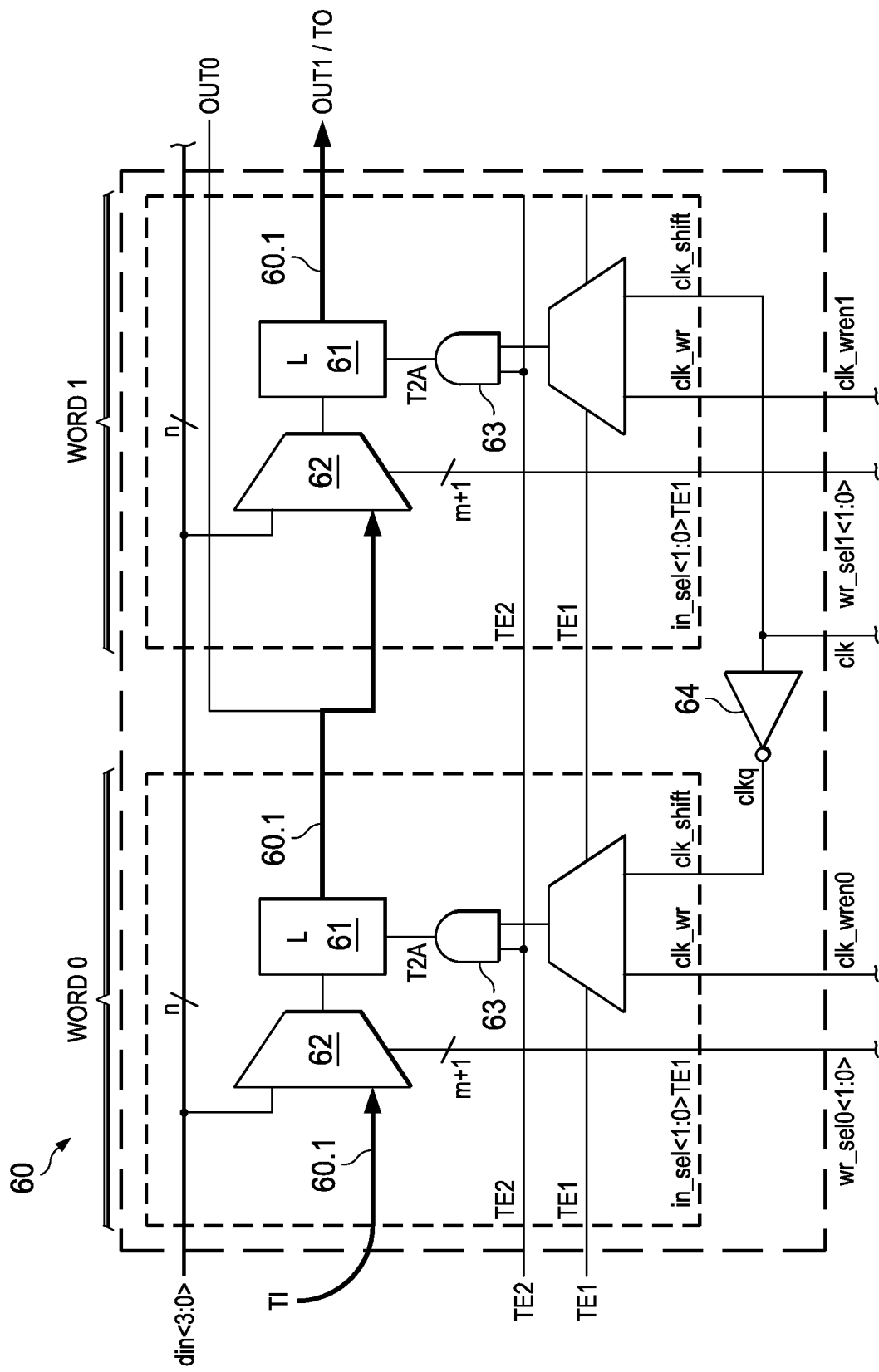
FIG. 10 shows one exemplary implementation of storage latches in a latch based memory device according to an embodiment of the present disclosure.

Referring to FIG. 10, one exemplary implementation of storage latches in a latch based memory device is depicted according to an embodiment of the present disclosure. The cell shown contains two core cells each core cell including a column of b storage latches 61, their associated multiplexers 62 and also the test circuitry for entering the test modes as described above (OR gate 63 and the MUX to globally select the enable signal for the latches). Clock inversion to enable a master-slave functionality of the latch pairs is implemented in the next hierarchy level (by inverter 64). More specifically, the register file 60 as shown in FIG. 10 includes storage cells, each storage cell containing a storage latch 61 and an associated multiplexer 62. The storage cells are arranged in the form of an array as described in previous embodiments. Only two storage cells of a first row are shown in FIG. 10. The storage cells are arranged in the form of storage words designated as word 0 and word 1.

With the test signals TE1 and TE2, the various test modes can be entered. When the first test signal TE1 is switched to TE1=1, while the second test signal TE2=0, the functionality of the storage latches 61 will be tested by controlling the multiplexers 62 to switch one of the at least one test input or the shift input to the output and serially connecting the storage latches 61. The data flow is as shown by lines 60.1 with a bit sequence being applied at shift input TI and an output TO is obtained from the last storage latch 61 of the shift register chain of the serially connected data latches 61. Thus, a shift mode has been entered when TE1 is 1 and TE2 is 0.

As was already explained in connection with FIG. 9, when the second test signal TE2 with a constant predefined potential, such as 1, is applied, the output of OR gates 63 is also set to 1. With their output being coupled to a control input of the data latches 61, the storage latches 61 will be configured to operate in a transparent state so that the functionality of the write decoder, the read decoder and the multiplexers 62 as well as the output multiplexers (not shown in FIG. 10) can be evaluated or tested by a conventional test approach, e.g., a scan test as described in connection with FIG. 9. Thus, a scan test mode has been entered when TE2 is set to 1.

Figure 11:
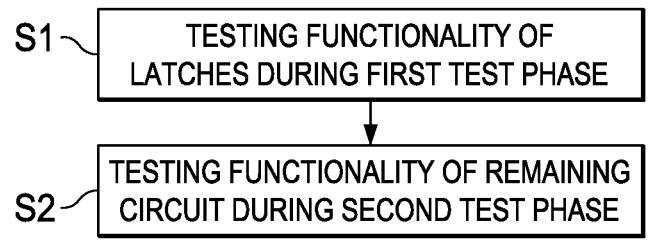
FIG. 11 shows a flowchart of an exemplary process for testing a latch based memory device according to one embodiment of the present disclosure.

Referring to FIG. 11, a flowchart of an exemplary process for testing a latch based memory device is depicted according to one embodiment of the present disclosure. The latch based memory device includes a plurality of latches, electrical connections and the circuit environment of the latches, in particular multiplexers and write and read decoders. The method includes testing the storage functionality of the latches during a first test phase (s1), and testing the functionality of the electrical connections and the circuit environment of the latches (including the multiplexers and decoders) during a second test phase (s2). The first test phase and the second test phase may be performed in any order without departing the spirit and scope of the present disclosure.

In step S1, during the first test phase, at least two pairs of latches are connected with each other to form a shift register chain. The shift register chain is a master-slave register chain in which the at least two pairs of latches are controlled by complementary clock signals during the first test phase.

In step S2, during the second test phase, at least part of the at least two pairs of latches are configured in a transparent state and a scan test is performed to evaluate the functionality of the electrical connections and the circuit environment of the latches in terms of structure of the circuit.

According to an embodiment of the method of FIG. 11, the method can be carried out within the latch based memory devices as described above and by using the various structural features contained therein. In particular, the method can be carried out by setting test signal TE1 or TE2 to a constant predefined potential during the first or second test phase.

For example, in FIG. 4, in a shift mode, shift testing of the data latches is performed by setting the test signal TE1 and the test control signals in_sel to a constant level of, e.g., 1. In FIG. 6, in a shift mode, shift testing of the input latches is performed by setting the test signal TE1 and the test control signals in_sel to a constant level of 1. Generally speaking, if the data or input latches to be tested are divided into a number of shift register chains for serial testing, then during each of the test phases, a global test signal TE1 and local control signals, such as TE1A in FIG. 6, controlling the multiplexers are set to a constant level of, e.g., 1.

Figure 12:
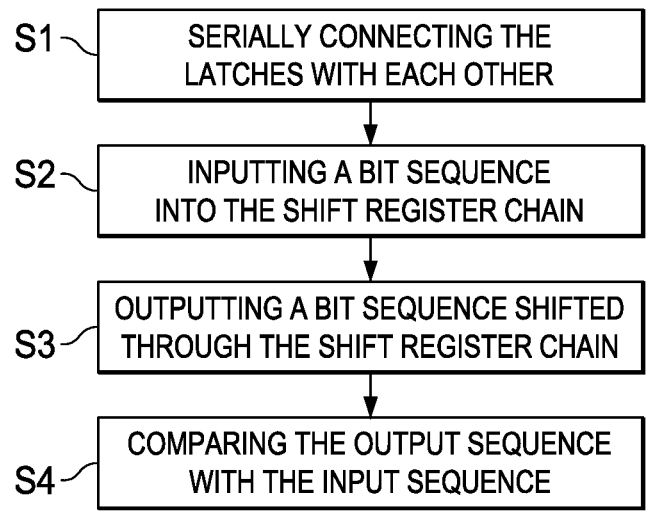
FIG. 12 shows a flow chart of an exemplary process for testing a latch based memory device in accordance with one embodiment of the present disclosure.

Referring to FIG. 12, a flow chart of an exemplary process for testing a latch based memory device is depicted in accordance with one embodiment of the present disclosure. The method includes serially connecting at least two pairs of latches with each other to form a shift register chain (s1), inputting a bit sequence into the shift register chain to shift the bit sequence through the shift register chain (s2), outputting a bit sequence shifted through the shift register chain (s3), and comparing the output bit sequence with the input bit sequence (reference) to evaluate the functionality of the latches (s4).

The bit sequence is of a sufficient length and comprises at least one data transition, for example, from 0 to 1 or from 1 to 0. The latch based memory device further includes a plurality of storage cells having at least two pairs of latches. Each storage cell including a multiplexer for each latch of the at least two pairs of latches. Each multiplexer comprises at least one test input and a control input. To form a shift register chain in S1, a test signal TE1 having a constant predefined potential, such as 1, is applied to connect one of the at least one test input or a shift input to the output of the multiplexer. The output of the first multiplexer is then connected with an input of a first latch of the at least two pairs of latches. The output of the first latch is then connected with one of the at least one test input or a shift input of a second multiplexer for a second latch of the at least two pairs of latches.

The at least two pairs of latches are controlled to form a master-slave shift register chain. This means that adjacent latches in the shift register chain are controlled with clock signals that are complementary to each other. In step S2, successive latches in the shift register chain are supplied with a clock signal and a complementary clock signal, respectively, so that one latch functions as master latch and the other latch functions as slave latch and the bit sequence can be shifted through the shift register chain.

The latch based memory device includes a register file, in particular, a read/write register file. The register file can be a single-port register file or a multi-port register file. In the register file, a plurality of input latches and a plurality of data latches are provided and are connected to one another. The method is carried out with one or both of the plurality of latches. In particular, the method can be carried out such that in a first step the method is performed with the data latches, and in a second step the method is performed with the input latches. However, it is not necessary to divide the testing into two steps for the input latches and the data latches. In principle it is also possible to connect the two partial shift register chains of the input latches and the data latches to obtain one single shift register chain and to input a longer bit sequence to be shifted through the chain and to perform the testing of the input latches and the data latches in one single step. It is possible to build any sort of partial shift chains and to test the shift chains in a parallel or serial manner. It is also possible to build partial shift chains containing input latches as well as data latches and to test them in parallel or serially.

According to an embodiment of the method of FIG. 12, the latch based memory device further includes electrical connections to and from the storage latches and the circuit environment of the storage latches the function of which is to control the plurality of storage latches, in particular, the input and output multiplexers and the read and write decoders. The method also includes testing this portion of the device. For example, for testing this portion of the device according to FIG. 9, the method further includes applying test bit patterns, e.g., via an external scan register wherein the term "external" means that the scan register is positioned in front of the latch-based memory device.

The storage latches can be configured, in a scan test mode, to operate in a transparent state in a scan test mode by applying a test control signal to configure the storage latches as buffers so that the storage latches do not influence the logic function of the remaining logic of the register file (control logic circuitry as well as input and output multiplexers). In this configuration, the remaining logic is purely of a combinatorial nature and may be tested, e.g., by known scan testing.

Alternatively, as shown in FIG. 10, a control signal having a constant predefined potential may be applied to an input of all storage latches to configure the storage latches to operate in a transparent state in the scan test mode. A test signal (TE2) having a constant predetermined potential may be applied to an input of all storage latches. Thus, it will be possible to enter the scan test mode for testing the control logic circuitry and the input and output multiplexers by simply setting the test signal (TE2) to a constant predetermined potential.

According to an embodiment of the method, the latch based memory device includes a plurality of input latches and a plurality of data latches and the method is carried out with the plurality of input latches. The input latches include a first set of latches and a second set of latches wherein the first set of latches are serially connected with the second set of latches. There are two modes of operation in which the input latches can be operated as was already explained in connection with FIG. 8.

In a functional mode, the second set of latches are configured to operate in a transparent state by applying a constant control signal, such as 1, at its clock pin so that the first latch can function as a master latch of the register file.

In a scan test mode, the first and second sets of latches are serially connected by means of multiplexers to form a scan register chain. Each one of the multiplexers is associated with a pair of first and second latches. The multiplexers each includes an output, one of at least one test input being a scan input, and at least one select control input. The output of each multiplexer is connected with an input of the first latch of the associated pair, and the scan input of the multiplexers is connected with an output of a second latch of another pair.

Also in the scan test mode, a test signal TE is supplied to the at least one select control input of the multiplexers, and one of the at least one test input being the scan input of each multiplexer is connected with the output of the respective multiplexer when the test signal TE=1. When TE=0, the first and second set of latches behave as a parallel register bank.

It is to be understood that the above described embodiments can also be combined in any possible manner or, in other words, features described in connection with one particular embodiment can also be applied to another embodiment if it is regarded as possible and adequate by the skilled person. In particular, features described in connection with the devices can be applied to the method and vice versa.

What is claimed is:

1. A method of testing a latch based memory device, the latch based memory device comprising a plurality of latches, electrical connections and circuit environments of the latches, the method comprising:
    testing a storage functionality of at least two latches during a first test phase, the at least two latches comprising at least a first latch and a second latch, the first latch being serially connected to the second latch via a first electrical connection; and
    testing a functionality of the first electrical connection and a first circuit environment of the at least two latches during a second test phase.

2. The method according to claim 1, further comprising configuring each of the at least two latches to operate in a transparent state during the second test phase.

3. The method according to claim 2, further comprising
performing, in the second test phase, a scan test to evaluate the correctness of the first electrical connection and the first circuit environment of the at least two latches in terms of structure of the circuit.

4. The method of claim 2, wherein the first latch is configured to refer to output data of the first latch as unconditional input data when operating in the transparent state.

5. The method of claim 2, wherein the first latch is a non-inverting latch that is configured to function as a buffer when operating in the transparent state.

6. The method according to claim 1, further comprising
providing at least one test signal for controlling and performing the first or second test phase, wherein the test signal is on a constant predefined potential during the first or second test phase, respectively.

7. A method of testing a latch based memory device, the latch based memory device comprising a plurality of latches, electrical connections and a circuit environment of the latches, the method comprising:
testing a storage functionality of the latches during a first test phase;
testing a functionality of the electrical connections and the circuit environment of the latches during a second test phase; and
connecting, in the first test phase, at least two pairs of the latches with each other so as to form a shift register chain, wherein the shift register chain is a master slave register chain in which the at least two pairs of the latches are controlled by complementary clock signals in the first test phase.

8. A method of testing a latch based memory device, the latch based memory device comprising a plurality of latches, electrical connections and a circuit environment of the latches, the method comprising:
testing a storage functionality of the latches during a first test phase; and
testing a functionality of the electrical connections and the circuit environment of the latches during a second test phase,
wherein the latch based memory device comprises:
the plurality latches, which include a first set of latches and a second set of latches, wherein each of the second set of latches is connectable to one of the first set of latches; and
a first set of multiplexers coupled to the first set of latches, wherein the first set of multiplexers comprises a first set of inputs having at least one data input and a second set of inputs having at least one test input, wherein an output of each of the first set of multiplexers is connected to an input of each of the first set of latches, and
wherein the first set of multiplexers are configured to be controlled by a first control signal and the second set of latches are configured to be controlled by a second control signal, the second control signal being separate from and independent of the first control signal.

9. A method for testing a latch based memory device comprising:
configuring a storage unit having a plurality of serially connected storage latches to receive data and operate as a first combinational logic unit during a testing phase, wherein the plurality of serially connected storage latches are configured to operate in a transparent state during the testing phase, the plurality of serially connected storage latches being serially connected to one another via one or more electrical connections; and
testing the one or more electrical connections during the testing phase, where testing the one or more electrical connections comprises providing input data to the storage unit from an input scan register, and checking at least one output of the storage unit with an output scan register.

10. The method of claim 9, wherein providing input data to the storage unit from an input scan register comprises:
providing an input unit of the latch based memory device connected to the storage unit; and
configuring the input unit to operate as the input scan register.

11. The method of claim 9, wherein providing input data to the storage unit from an input scan register comprises:
providing an input unit of the latch based memory device connected to the storage unit, wherein the input unit comprises a plurality of input latches;
configuring the input unit to operate as a second combinational logic unit by configuring the plurality of input latches to operate in a transparent state; and
configuring the input unit to receive data from the input scan register.

12. The method of claim 9, further comprising:
forming, during the testing phase, a shift register chain by connecting at least two pairs of the serially connected storage latches with one another, wherein the shift register chain is a master slave register chain in which the at least two pairs of serially connected storage latches are controlled by complementary clock signals in the testing phase.

13. The method of claim 9, further comprising:
performing, during the testing phase, a scan test to evaluate the one or more electrical connections of the serially connected storage latches.

14. The method of claim 9, further comprising:
performing, during the testing phase, a scan test to evaluate a circuit environment of the serially connected storage latches.

15. The method of claim 9, further comprising:
providing at least one test signal for controlling the testing phase, wherein the at least one test signal comprises a constant predefined potential during the testing phase.

16. The method of claim 9, wherein the latch based memory device comprises:
a first set of latches and a second set of latches, wherein each of the second set of latches is connectable to one of the first set of latches; and
a first set of multiplexers coupled to the first set of latches, wherein the first set of multiplexers comprises a first set of inputs having at least one data input and a second set of inputs having at least one test input, wherein an output of each of the first set of multiplexers is connected to an input of each of the first set of latches, and
wherein the first set of multiplexers are configured to be controlled by a first control signal and the second set of latches are configured to be controlled by a second control signal, the second control signal being separate from and independent of the first control signal.

17. The method of claim 9, wherein the plurality of serially connected storage latches include at least a first latch, the first latch being configured to refer to output data of the first latch as unconditional input data when operating in the transparent state.

18. The method of claim 9, wherein the plurality of serially connected storage latches include at least one non-inverting latch, and wherein the at least one non-inverting latch is configured to function as a buffer when operating in the transparent state.

19. The method of claim 9, wherein the plurality of serially connected storage latches include at least one inverting latch, and wherein the at least one inverting latch is configured to function as an inverting buffer when operating in the transparent state.

* * * * *